United States Patent
Vaz et al.

(10) Patent No.: US 10,476,514 B1
(45) Date of Patent: Nov. 12, 2019

(54) CIRCUIT FOR AND METHOD OF RECEIVING DATA IN AN INTEGRATED CIRCUIT

(71) Applicant: Xilinx, Inc., San Jose, CA (US)

(72) Inventors: Bruno Miguel Vaz, Sao Domingos de Rana (PT); John E. McGrath, Cahir (IE); Conrado K. Mesadri, San Jose, CA (US); Woon C. Wong, Dublin, CA (US); Ali Boumaalif, Cork City Centre (IE); Christophe Erdmann, Dublin (IE); Brendan Farley, Donabate (IE)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 15/992,797

(22) Filed: May 30, 2018

(51) Int. Cl.
| | | |
|---|---|---|
| *H03M 1/12* | (2006.01) | |
| *G01R 31/3185* | (2006.01) | |
| *H03M 1/10* | (2006.01) | |
| *H04L 12/43* | (2006.01) | |
| *H04L 12/433* | (2006.01) | |

(52) U.S. Cl.
CPC .. *H03M 1/1215* (2013.01); *G01R 31/318519* (2013.01); *H03M 1/1071* (2013.01); *H04L 12/43* (2013.01); *H04L 12/433* (2013.01)

(58) Field of Classification Search
None
See application file for complete search history.

(56) References Cited

U.S. PATENT DOCUMENTS

| | | | |
|---|---|---|---|
| 6,642,751 B1 * | 11/2003 | Quinn | G11C 27/026 327/337 |
| 7,366,803 B1 | 4/2008 | Gaither | |
| 7,555,690 B1 | 6/2009 | Yang et al. | |
| 7,574,635 B1 | 8/2009 | Alfke | |
| 7,685,340 B1 | 3/2010 | Gaither | |
| 7,701,070 B1 | 4/2010 | Li et al. | |
| 7,994,609 B2 | 8/2011 | Quinn | |
| 7,994,610 B1 | 8/2011 | Quinn | |
| 8,099,449 B1 | 1/2012 | Schultz | |
| 8,180,919 B1 | 5/2012 | Mellin et al. | |
| 8,207,592 B2 | 6/2012 | Quinn | |
| 8,258,845 B1 | 9/2012 | Alexander et al. | |
| 8,362,589 B2 | 1/2013 | Quinn | |
| 8,548,071 B2 | 10/2013 | Collins | |
| 8,842,034 B1 | 9/2014 | Gong | |
| 9,111,042 B1 * | 8/2015 | Mendel | G06F 13/385 |
| 9,313,054 B1 | 4/2016 | Liao et al. | |
| 9,461,851 B1 | 10/2016 | Liao et al. | |
| 9,490,832 B1 | 11/2016 | Zhou et al. | |
| 9,503,115 B1 | 11/2016 | Shin et al. | |

(Continued)

*Primary Examiner* — Howard Williams
(74) *Attorney, Agent, or Firm* — John J. King

(57) ABSTRACT

An integrated circuit is described. The integrated circuit comprises a first portion having programmable resources; a second portion having hardened circuits including an analog-to-digital converter circuit configured to receive an input signal and generate an output signal; and a monitor circuit configured to receive an output signal generated by the analog-to-digital converter circuit; wherein the monitor circuit is configurable to control a calibration of the analog-to-digital converter circuit based upon signal characteristics of the output signal generated by the analog-to-digital converter circuit. A method of receiving data in an integrated circuit is also described.

20 Claims, 11 Drawing Sheets

(56) References Cited

U.S. PATENT DOCUMENTS

| | | |
|---|---|---|
| 9,558,129 B2 | 1/2017 | Arbel et al. |
| 9,584,145 B1 | 2/2017 | Shin et al. |
| 9,595,990 B1 | 3/2017 | Zhang et al. |
| 9,806,915 B1 | 10/2017 | Elzeftawi et al. |
| 9,935,733 B1 | 4/2018 | Lesea |
| 9,966,908 B1 | 5/2018 | Carey |
| 2005/0242836 A1* | 11/2005 | Goetting ............ G01R 31/3167 326/39 |
| 2019/0044637 A1* | 2/2019 | Gulstone ................ H04J 3/067 |

* cited by examiner

US 10,476,514 B1

CIRCUIT FOR AND METHOD OF RECEIVING DATA IN AN INTEGRATED CIRCUIT

GOVERNMENT RIGHTS

This invention was made, in part, with Government support under Agreement No. HR0011-16-3-0004, awarded by Defense Advanced Research Projects Agency. The Government has certain rights in the invention.

TECHNICAL FIELD

The present invention relates generally to integrated circuit devices, and in particular to a circuit for and a method of receiving data in an integrated circuit device.

BACKGROUND

Conventional radio frequency (RF) time-interleaved (TI) analog-to-digital converter (ADC) circuits may rely on several background (BG) calibration algorithms to maximize its performance. However, these BG calibration algorithms may rely on the input signal to be present sufficiently long time to reach the required performance. Furthermore, if the BG calibrations, such as gain and time skew calibrations are kept working when signal is not present, it leads to divergence of the calibrations and consequently requires re-convergence when the signal returns, which may not be tolerable in some cases.

Some irregular signals in practical applications, such as burst mode signals used in cable applications and wireless communications, or unpredictable signals from in radar applications for example, can dramatically limit the accuracy of the BG calibration blocks if no intelligent control is used while receiving the data.

In conventional applications using discrete ADC devices, the control of the calibrations may be hardened in the device, making it difficult for users to configure it or tweak it as a function of the input signal characteristics and application. Furthermore, the use of JESD interfaces with discrete ADCs makes it difficult to optimize or include reactive control by an application, which leads to many sub-optimal implementations.

Further, during start-up, it may be necessary to run a foreground (FG) calibration cycle to maximize performance of the offset calibration loops. It may take a long time to settle to sufficient accuracy (e.g. >2 s) using static calibration integration coefficients, which may be too slow for some applications.

Accordingly, there is a need for receivers having improved calibration.

SUMMARY

An integrated circuit is described. The integrated circuit comprises a first portion having programmable resources; a second portion having hardened circuits including an analog-to-digital converter circuit configured to receive an input signal and generate an output signal; and a monitor circuit configured to receive an output signal generated by the analog-to-digital converter circuit; wherein the monitor circuit is configurable to control a calibration of the analog-to-digital converter circuit based upon signal characteristics of the output signal generated by the analog-to-digital converter circuit.

A method of for receiving input signals is also described. The method comprises providing a first portion of a circuit having programmable resources; providing a second portion having hardened circuits including an analog-to-digital converter circuit; receiving an input signal at the analog-to-digital converter circuit; generating, by the analog-to-digital converter circuit, an output signal based upon the input signal; coupling a monitor circuit to receive the output signal generated by the analog-to-digital converter circuit; and configuring the monitor circuit to control a calibration of the analog-to-digital converter circuit based upon signal characteristics of the output signal generated by the analog-to-digital converter circuit.

DETAILED DESCRIPTION

Figure 1:
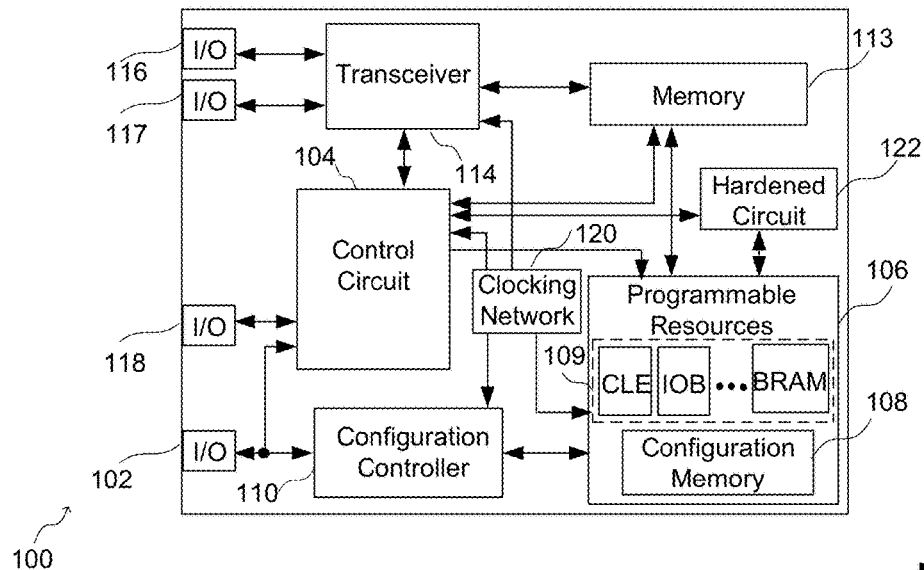
FIG. 1 is a block diagram of an integrated circuit having circuits for receiving data.

The circuits and methods set forth below enable improving the robustness of both foreground calibration and background calibration of an ADC, including by taking advantage of the flexibility of programmable resources of a programmable logic devices (PLD's), such as field programmable gate arrays (FPGAs). The circuits and methods enable a user of an integrated circuit device such as an FPGA to flexibly optimize the calibration control, such as for input data received by an ADC, based on signal characteristics associated with the ADC. According to some implementations, access to hold or freeze control of the calibration is provided from an FPGA fabric. Close monitoring of the ADC signal is provided, including low latency connection between the ADC and a monitoring block. The circuits and methods also enable the implementation of control blocks which allow minimizing the power of the tuning operation based upon signal characteristic.

The integration of ADCs inside the FPGA enables tuning the control of the ADC so that the operation of the ADC can be optimized regardless of the nature of the signal. According to some implementations, the monitoring circuit can comprise power detection circuit to monitor power or an envelope detection circuit to monitor the frequency for example. When signal power is lower than a certain programmable power threshold or the frequency of the signal is lower than a certain programmable frequency threshold, the calibration integration loops may be frozen, where the calibration loops are re-activated when the signal power or envelope is large enough again. Further, by performing the monitoring in programmable logic fabric, a user of the integrated circuit device has the ability to optimize detection and control operations as a function of the application and signal characteristics. For example, a user has the ability to design a detection block as a function of the characteristics of their signals. Therefore, the solution can be an optimized design in terms of power dissipation for many applications, or a more complex detection block that enables superior performance for more demanding applications.

According to other implementations, dynamic integration coefficients for an ADC may be generated. For example, at start-up, a start integration may be performed with a low accuracy, but fast coefficient selection. A few integration coefficients are cycled through until the coefficient is accurate enough to provide a required performance. The integration coefficient is then frozen and the ADC is activated. By using dynamic integration coefficients, the calibrations may settle in less than 2 milliseconds (ms). The circuits and methods can also be applied during normal operation in specific use cases to speed up the convergence of the background calibration loops when a disruptive event occurs.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109 and other programmable resources, such as input/output blocks (IOBs) and blocks of random access memory (BRAMs). Configuration data may be provided to the configuration memory 108 by a configuration controller 110. The configuration data enables the operation of the programmable resources 106. A memory 113 may be coupled to the control circuit 104 and the programmable resources 106. A transceiver circuit 114, which comprises a transmitter and a receiver, may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. The circuit also includes hardened circuits 122.

Integrated circuit devices can have circuits implemented in different ways. For example, an application specific integrated circuit (ASIC) includes circuits which are hardened, or implemented as fixed circuits. The hard blocks of an ASIC may receive different signals to implement different functions, but the circuit elements making up the hard blocks are not reconfigurable. In contrast, Programmable Logic Devices (PLDs) comprise programmable resources that are reconfigurable to implement different functions. Some integrated circuits, such as the integrated circuit of FIG. 1, may comprise both hard blocks and programmable resources, as will be described in more detail below in reference to FIGS. 19 and 20, that are reconfigurable to implement different functions. By way of example, in addition to programmable resources such as the configurable logic element of FIG. 20, these hardened blocks may be data transceivers and associated control circuit, such as ADC circuits of the circuit of FIG. 19. While the circuit of FIG. 1 is provided by way of example, the circuits for and methods of implementing an ADC circuit can use other circuit elements.

Figure 2:
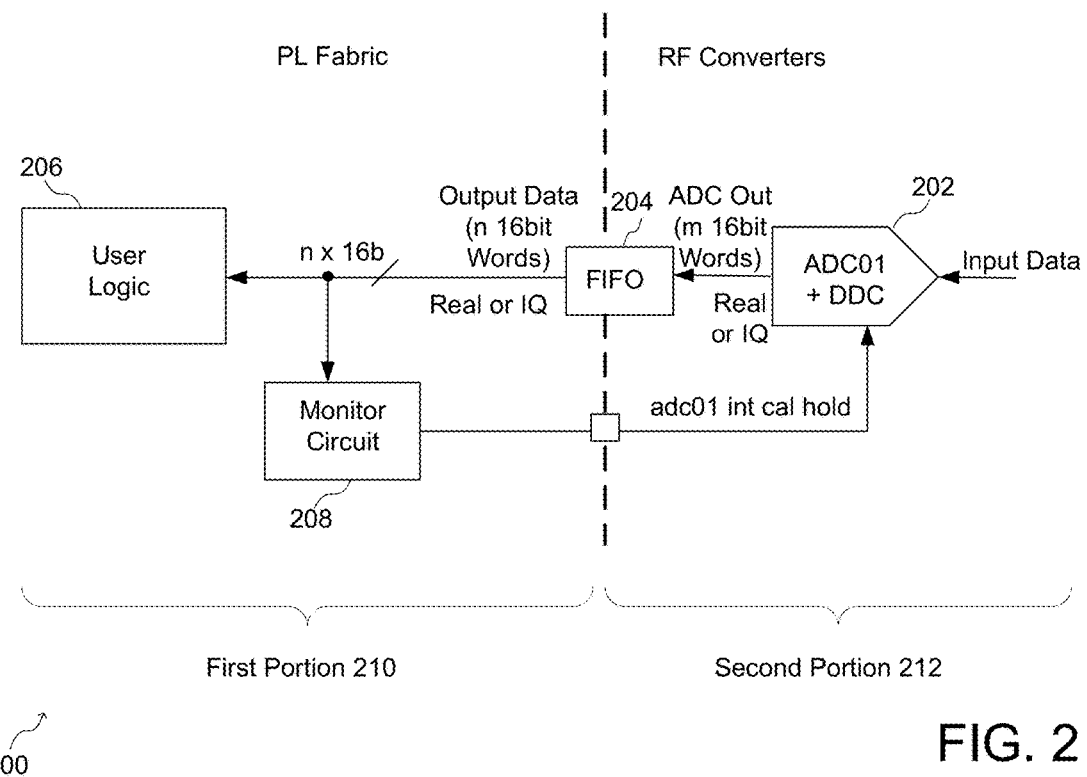
FIG. 2 is a block diagram of a circuit for receiving data in an integrated circuit device.

Turning now to FIG. 2, a block diagram of a circuit 200 for receiving data in an integrated circuit device is shown. In particular, an analog-to-digital converter (ADC) circuit 202, shown here by way of example as ADC01 having a Digital Down Converter (DDC), receives Input Data from an analog input signal and generates Output Data, such as a 16-bit word. The ADC circuit 202 may comprise multiple ADCs, shown by way of example in FIG. 2 as having m ADC circuits generating m 16-bit output words. The output of the ADC circuit 202 is provided to a first-in, first out (FIFO) circuit 204, which generates n 16-bit output words that are provided to user logic 206, which may be for example programmable resources of a programmable logic device as will be described in more detail below in FIGS. 19 and 20. A monitor circuit 208 is also coupled to the output of the FIFO 204. According to one implementation, the monitor circuit 208 could be a level detection circuit to measure a voltage of an output of the ADC for example. As shown in FIG. 2, the user logic 206 and the monitor circuit 208 are a part of first portion 210 comprising programmable logic (PL) fabric, also known as programmable resources, while a second portion 212 comprising hard circuits that may include radio frequency (RF) converter circuit, which includes for example the ADC circuit 202.

The circuit of FIG. 2 enables improving the robustness of background calibration of an ADC by taking advantage of the flexibility of the PL fabric. Calibration control for the ADC may be implemented based on signal characteristics of the output of the ADC detected by the monitor circuit 208. Close monitoring of the ADC the signal can be achieved with low latency between the ADC and the monitoring circuit 208. The circuits and methods also enable the implementation of arbitrary control blocks which allow minimizing the power of the tuning operation based upon signal characteristic. By implementing the monitoring of the ADCs inside the PL fabric, control of the ADCs can be optimized regardless of the nature of the signal being monitored. According to some implementations, the monitoring circuit 208 can be power detector or an envelope detector for example. When signal power is lower than a certain programmable threshold, such as lower than −40 dBFs for 100 µs for example, the calibration of the ADC may be held or frozen, where the calibration is re-activated when the signal power or envelope is large enough again. Further, by performing the monitoring in the PL fabric, a user of the integrated circuit device has the ability to optimize detection and control operations as a function of an application and signal characteristics.

According to some implementations, ON-OFF states of elements of the ADCs, such as calibration circuits including for example offset control circuits, gain control circuits, and timing circuits, can be controlled by a hold signal generated by the monitoring circuit. For example, ON-OFF states of an offset calibration block (OCB) a gain calibration block (GCB), and a time skew calibration block (TSCB), which will be described in more detail in reference to FIG. 8, could be controlled by signals from the monitoring circuit that are provided to the ADCs. If the monitor is implemented as a signal level detection circuit, some objectives of the signal level detection circuit may include to minimize circuit requirements while providing robust level detection with hysteresis to control the ADC calibration state. The monitoring circuit can be replicated for a number of ADCs that are active in the system. It is also desirable that flexibility is provided to change the time constants of the level detection circuit and time constants of the hysteresis mechanism. The ADCs may also be configured to multiple words, such as up to 16 16-bit words. As will be described in more detail below, the control of the ADC should allow for manual control, such as direct register control, and reading an output of a level detection circuit through register access.

Figure 3:
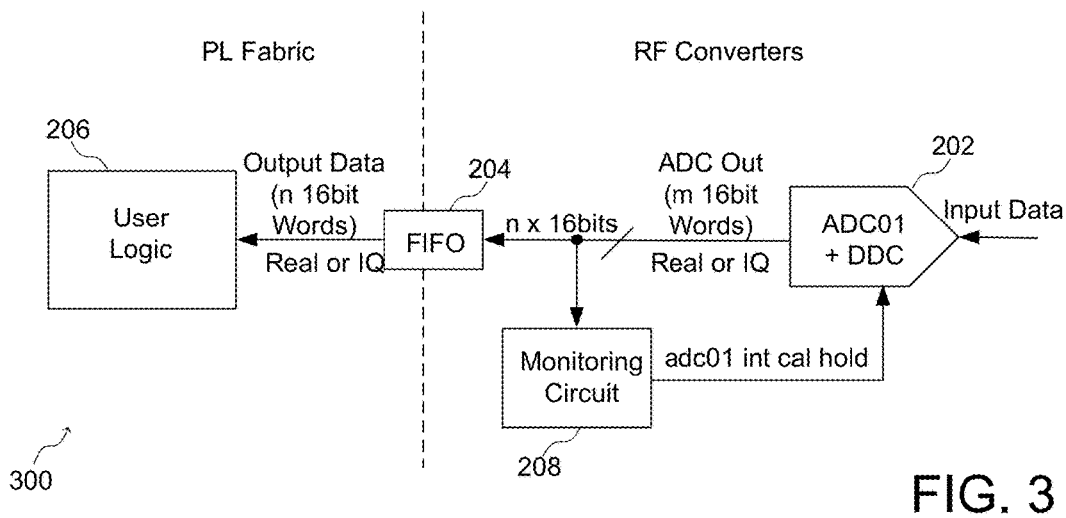
FIG. 3 is a block diagram of another circuit for receiving data in an integrated circuit device.

Turning now to FIG. 3, a block diagram of another circuit 300 for receiving data in an integrated circuit device is shown. According to the implementation of FIG. 3, the monitoring circuit 208 is provided in the hard circuits. By way of example, the monitoring circuit may be hardened inside an ADC tile having ADC circuits. Implementing the ADC circuits in hard circuits enables minimizing control of the ADC, such as calibration, for some customers and applications, and therefore reducing the overall power dissipation and freeing up PL fabric resources for other functionality. According to some implementations, a circuit may have ADCs having a monitor circuit in the PL fabric to provide increased flexibility in controlling the ADCs and other ADCs that have a monitor circuit in the hardened circuits to reduce power.

Figure 4:
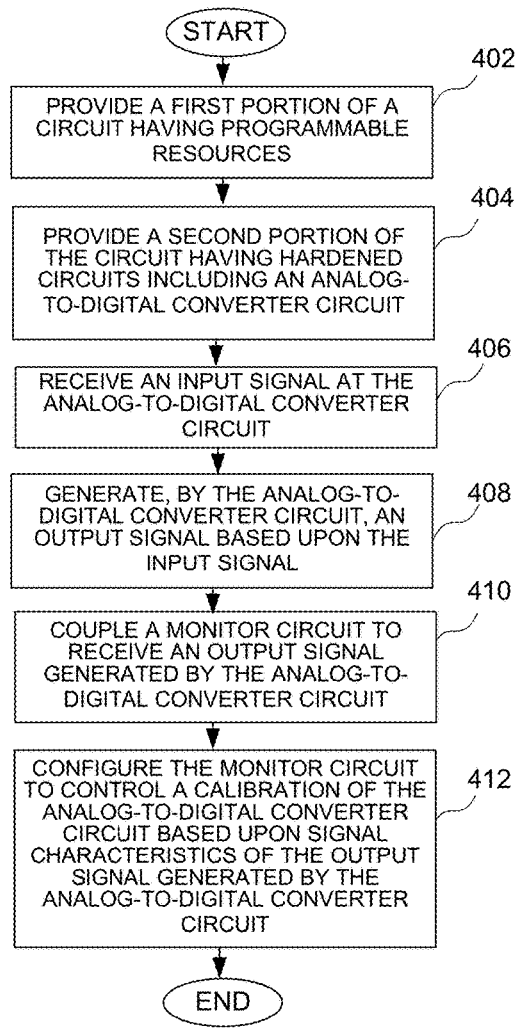
FIG. 4 is a flow chart showing a method of receiving data.

Turning now to FIG. 4, a flow chart shows a method of receiving input signals using a monitoring circuit, such as a monitoring circuit described in FIGS. 2 and 3. A first portion of a circuit having programmable resources is provided at a block 402. The first portion of the circuit for receiving data could be programmable resources, such as the PL Fabric of FIGS. 2 and 3 for example or programmable resources described in reference to FIGS. 19 and 20. A second portion of the circuit having hard circuits including an analog-to-digital converter circuit is provided at a block 404. The hard circuits may comprise an ADC circuit for example. An input signal is received at the analog-to-digital converter circuit at a block 406. An output signal is generated by the analog-to-digital converter circuit based upon the input signal at a block 408. A monitor circuit, such as the monitor circuit 208 for example, is coupled to receive an output signal generated by the analog-to-digital converter circuit at a block 410. The monitor circuit is configured to control a calibration of the analog-to-digital converter circuit based upon signal characteristics of the output signal generated by the analog-to-digital converter circuit at a block 412.

Figure 5:
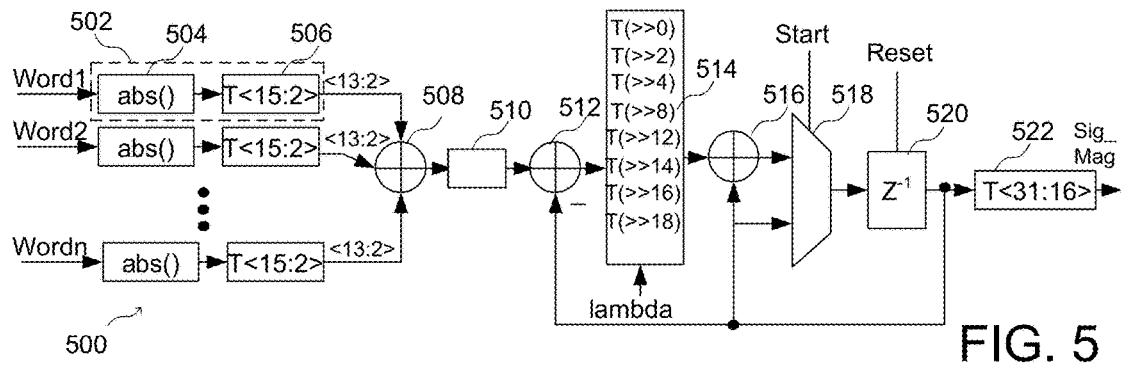
FIG. 5 is a block diagram of a signal magnitude leaky integrator circuit.

Turning now to FIG. 5, a block diagram of a signal magnitude leaky integrator circuit 500 is shown. The circuits of FIGS. 5-6, including the control circuit 602 implementing the Finite State Machine (FSM) of FIG. 7, could be implemented in the monitor circuit 208 to generate a hold signal provided to the ADC as will be described in more detail below. According to the implementation of FIG. 5, the circuit 500 comprises a plurality of input stages 502, shown here by way of example as n input stages, each configured to receive one of the n input words and comprising an absolute value circuit 504 that generates an absolute value of the input word which is coupled to a truncation circuit 506. The truncation circuit 506 generates a truncated value of the word that is provided to an adder circuit 508. According to the implementation of FIG. 5, the truncation circuit 506 truncates the last 2 bits of the absolute value of the word. An output of the adder circuit 508 is provided to left shift circuit 510 which performs a left shift of the output of the adder circuit 508. An output of the left shift circuit 510 is provide to a subtractor circuit 512, an output of which is provided to right shift circuit 514 that shifts m bits to the right, where m is selectable from a list of values, provides a sign extension, and truncates the least significant bit (LSB). A right shift circuit 514 receives a control signal lambda which selects an output of the right shift circuit 514 that is provide to an adder circuit 516. According to one implementation, lambda may comprise integration coefficients, such as $u_{off}$ and $u_c$ as will be described in more detail below. An output of the adder circuit 516 is provided to a selection circuit 518, shown here by way of example as a multiplexer receiving a start signal at the selection input, that also receives a delayed output, of the selection circuit 518 that is delayed by a delay element 520. The delayed output of the selection circuit 518 is coupled to an input of the adder circuit 516 and a truncation circuit 522 to generate a signal magnitude (Sig-Mag) signal 522.

A first part of the detector comprising the input stages 502 averages the n input words and may be extended to 32 bits for the leaky integrator circuit in the second part in FIG. 5. Although the ADC output may be 12-bit signed signal and MSB aligned to 16 bits at the final output, 14 bits may be kept for cases where Quadrature Modular Correction (OMC) gain is used. The first adder 508 bit-width may be sized according to the number of input words n. For example, if n is 2, then the adder size shall be 15 bits. If n is 16, then the adder size shall be 18 bits. The left shift operation by left shift circuit 510 following the adder 508 performs an averaging of the n words. If n is not a power of 2, then a scale factor of $n/2^{\lceil \log 2(n) \rceil}$ may be used at the final output. For example, if n=14, then 14/16 will be the scaling factor at the output because 4 bits will be used to extend the adder from 14 to 18; essentially dividing the sum of the 14 inputs by 16 before the leaky integrator circuit of FIG. 5. The leaky integrator with programmable time constants, which may be from 1 fabric clock to 2^18 fabric clocks. The output Sig_mag may be truncated to 16 bits and feed to the hysteresis counter circuit of FIG. 6 for a hysteresis handling.

Figure 6:
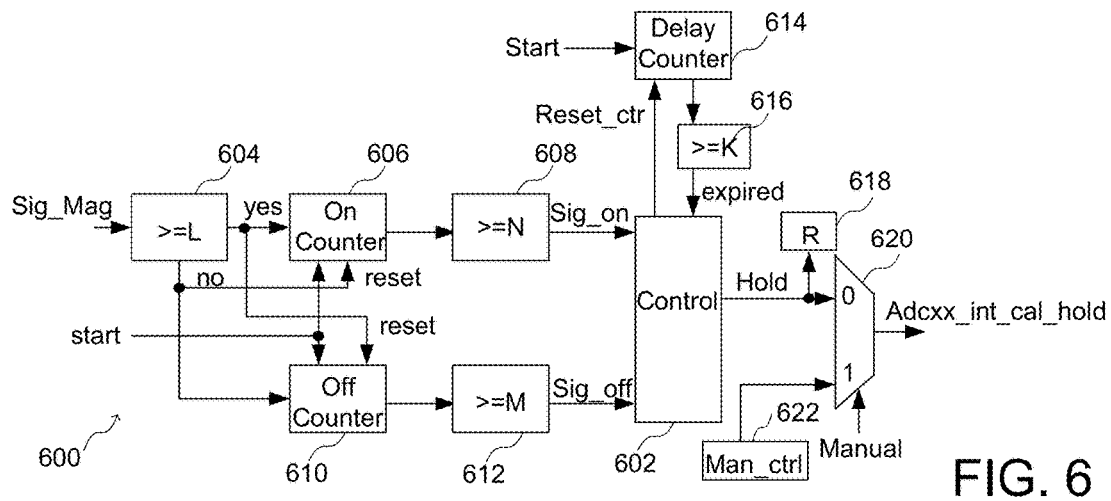
FIG. 6 is a block diagram of a hysteresis counter circuit.

Turning now to FIG. 6, a block diagram of a hysteresis counter circuit 600 is shown. More particularly, the hysteresis counter circuit 600 receives the signal magnitude generated in FIG. 5 and comprises a control circuit 602, which may be configured to implement a finite state machine (FSM) as shown by way of example in FIG. 7. The control circuit 602 receives a signal on (Sig_on) value based upon the Sig-Mag signal from a first path comprising a comparator circuit 604 configured to determine whether the Sig_mag signal is greater than a value L, which represents a comparison threshold for the signal magnitude at the output of the magnitude leaky detector. If the signal value is greater than or equal to L, an affirmative output (yes) of the comparison is provided to an On counter 606, while a negative output (no) of the comparison provides a reset signal to the On counter 606. When a count generated by the On counter 606 is greater than or equal to a predetermined count N in the comparator 608, which is a value for an On counter comparison, the Sig_on signal gets asserted, which is provided to the control circuit 602.

The negative output (no) of the comparator circuit 604 is also provided to an Off counter 610, which is reset by the affirmative output of the comparator 604. An output of the Off counter 610 is coupled to another comparator 612, which asserts the Sig_off signal if the output of the off counter 610 is greater than a predetermined value M, which is a value for the Off counter comparison. Each of the On counter 606 and the Off counter 610 is configure to receive a start signal to start the operation of the circuit 600. A delay counter 614 also receives the start signal and a reset control (Reset_ctr) signal to determine if a delay counter 614 has reached a value greater than or equal to a predetermined value K in the comparator 616, in which case the operation has expired as indicated by an expired signal. The value of K is selected to delay the hold state change by a predetermined time, such as 10 us for example. This delay allows the ADC enough time to execute a previous change in the calibration state.

The control circuit 602 generates a hold signal (also known as a freeze signal) representing a current value of the hold state from the control circuit 602 that is stored in a register 618 and provided to an input of a selection circuit 620, shown here as a multiplexer, that is adapted to receive a manual control (Man_ctrl) register 622 at a second input. The Manual mode allows a user to directly control the holding or freezing of the calibration operation through register writes using a manual control (Man_ctrl) signal and a manual (Manual) selection circuit control signal. By way of example, a value of 1 for the Manual signal will allow a user to manually control the hold state with register control by programming a 0 or 1 in the Man_ctrl register 622. A signal Adcxx_int_cal_hold is hold signal generated at an output of the multiplexer, where xx designates the number of the ADC.

During operation, the output of the leaky integrator circuit of FIG. 5 feeds into the hysteresis counter block of FIG. 6, where the signal is considered ON when the input is greater than or equal to a threshold L for N consecutive clocks and is considered OFF if the input is less than L for M consecutive clocks. The control circuit 602 then controls when the hold state can change. It should be noted that the counters of FIG. 6 saturate to a maximum value if it reaches the maximum count possible; where resets can be used to set the counters back to 0. The hold signal (Adcx_int_cal_hold) generated by the circuit 600 of FIG. 6 is provided to control operation of an ADC, such as the ADC circuits 202 of FIGS. 2 and 3 for example, and more particularly holding calibration operations of control circuits such as offset control, gain control and timing control circuits including skew control.

Figure 7:
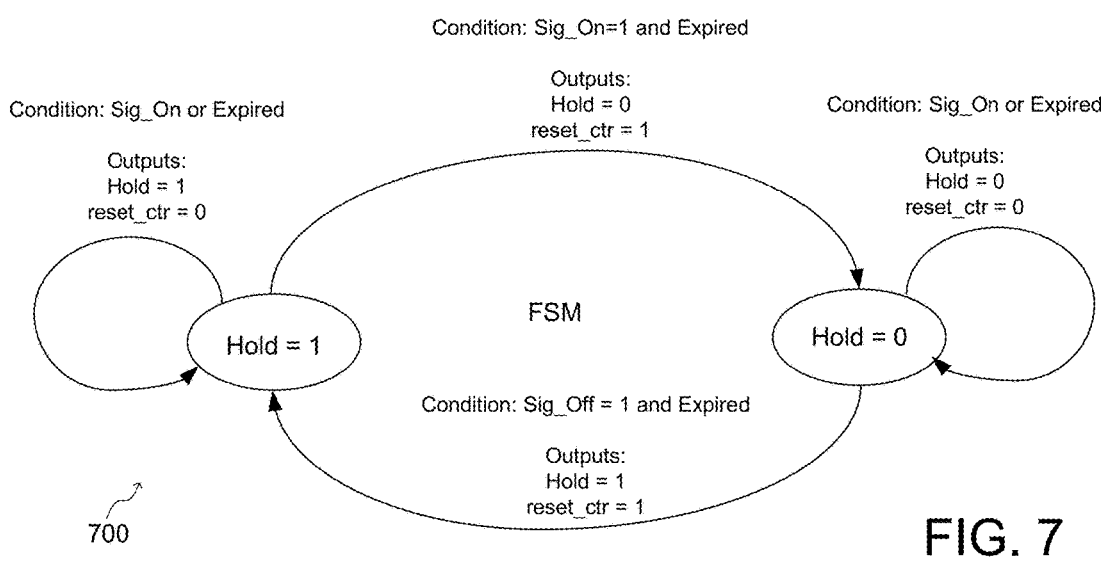
FIG. 7 is a diagram of a finite state machine that could be implemented in the of hysteresis counter circuit of FIG. 6.

Turning now to FIG. 7, a diagram of a finite state machine that could be implemented in 602 of FIG. 6 is shown. As shown in FIG. 7, the 2 states of the finite state machine comprise a Hold=1 state and a Hold=0 state. When in the Hold=1 state, the FSM remains in the state for a condition that Sig_on or Expired is generated, where the outputs are Hold=1 and reset_ctr=0. When the condition is that Sig_on=1 and expired, the outputs are Hold=0 and reset_ctr=1. When in the Hold=0 state, the FSM remains in the state for a condition that Sig_on or Expired is generated, where the outputs are Hold=0 and reset_ctr=0. When the condition is that Sig_off=1 and Expired, the outputs are Hold=1 and reset_ctr=1.

Figure 8:
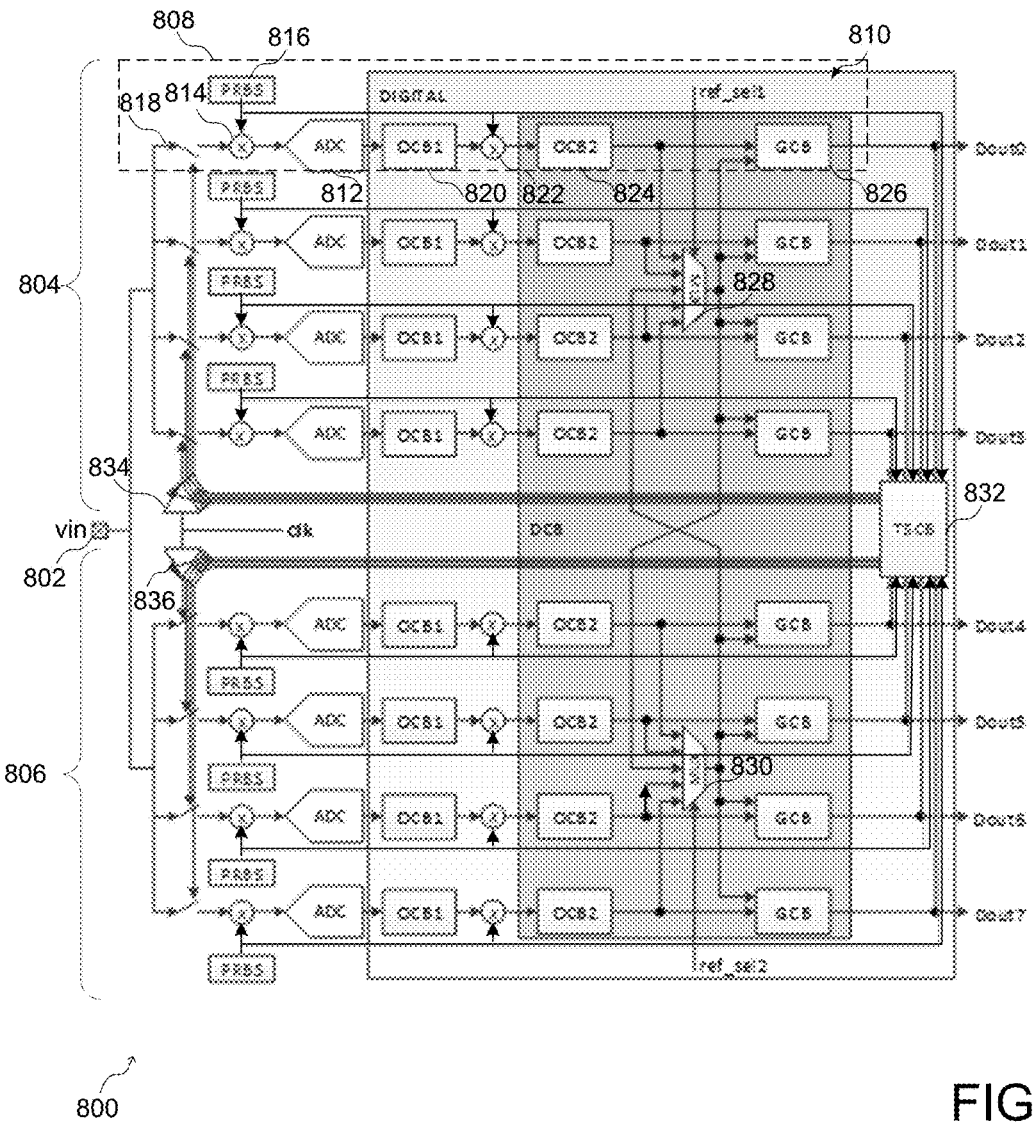
FIG. 8 is a block diagram of a time-interleaved calibration circuit.

Turning now to FIG. 8, a block diagram of a time-interleaved calibration circuit is shown. As shown in FIG. 8, the time interleaved calibration circuit comprises a signal input 802 adapted to receive and input signal (yin) and coupled to a plurality of ADC stages in a first portion 804 and a second portion 806. Each ADC stage comprises a digital portion 810 that is coupled to an output of an ADC 812 that receives an output of a multiplier 814 configured to receive the input signal and a signal generated by a signal generator 816, shown here by way of example as a PRBS signal generator. The application of the input signal yin to the multiplier 814 is controlled by a switch 818.

The digital portion 810 of the ADC stage 808 comprises a first offset calibration block (OCB) 820 coupled to receive an output of the ADC 812 and having an output coupled to a multiplier 822 that also receives the output of the signal generator 816. An output of the first offset calibration block is coupled to a gain calibration block (GBC) 826 and an input of a selection circuit 828 adapted to receive outputs of a plurality of ADC stages, shown here by way of example as receiving an output of the offset calibration blocks of each of the stages of the first portion 804 of ADC stages. An output of the selection circuit 828 is coupled to each of the gain calibration blocks 826 for the first portion 804 and to an input of a selection circuit associated with the second portion 806. A time skew calibration block (TSCB) 832 controls the application of control signals to switches of the first portion 804 by way of control buffers 834 and to switches of the lower portion 806 by way of control buffers 836. The output of the selection circuit 828 is controlled by a first reference selection (ref_sel1) signal and the output of the selection circuit 830 is controlled by a second reference selection (ref_sel2) signal to enable time interleaving of the input signal yin.

The requirements and limitation of the time-interleaved calibration blocks are now described, where multiple options to enable increasing the flexibility and robustness of the system for different application and use cases. For start-up requirements, OCB2 824 may require a foreground (FG) calibration cycle without an input signal. This procedure may be done during power-up and may take up to 2 seconds to achieve good noise floor and time interleaved (TI) offset spur levels. It should be noted that during start-up only OCB1 and OCB2 converge to the correct calibration state. The GCB and TSCB require a moving input signal to converge to the correct calibration states. A simplified start-up sequence may be implemented as follows: run sub-ADC FG calibrations (approximately a few microseconds); enable sub-ADC BG calibrations; run TI OCB1/OCB2 FG calibration (approximately 2 s); and enable GCB/TSCB BG calibration. For most use cases, this timing requirement is acceptable as there is continuous traffic in the lines and application can tolerate a few hundreds of milliseconds of convergence before data is sufficiently accurate. For other use cases, such as some radar applications, it might be necessary to provide training signals to get convergence on the GCB and TSCB before a system start operation.

The OCB blocks are now described, where an integration coefficient of OCB1 and OCB2 has to be at least 2^−26 (i.e. 2 raised to the exponent of (−26)) to guarantee sufficient performance. Increasing the integration coefficient to, e.g. 2^−25 or 2^−24, starts raising the noise floor due the reduced accuracy of OCB1 in combination with the effect of the chopping operation and increases the median of the residual TI offset spurs due to the reduced accuracy of OCB2. If it is desirable to keep the current noise floor and TI offset spur amplitude levels, the integration coefficient should be kept at 2^−26. OCB2 calibration generally runs only at start-up and requires that the input signal have no content at multiples of FSch during calibration. After calibration is complete, the internal integrators may be frozen and the fixed offset quantity continues to be removed from the data.

Describing the interleaving calibration blocks, the TI gain and TI skew calibration blocks require the input signal to be present for convergence. The calibration codes generally diverge wherein the interleaving calibrations are kept running while the signal is not present. Therefore, it may be beneficial to disable these calibration blocks when the signal is not present. It is Important to note while there are some burst mode use cases in cable and wireless that may not require the calibrations to be disabled, disabling the interleaved calibration blocks may be implemented as default. Furthermore, the interleaving calibrations may diverge during over-range and over-voltage events, and it may therefore be beneficial to disable these calibration under this conditions as well.

Figure 9:
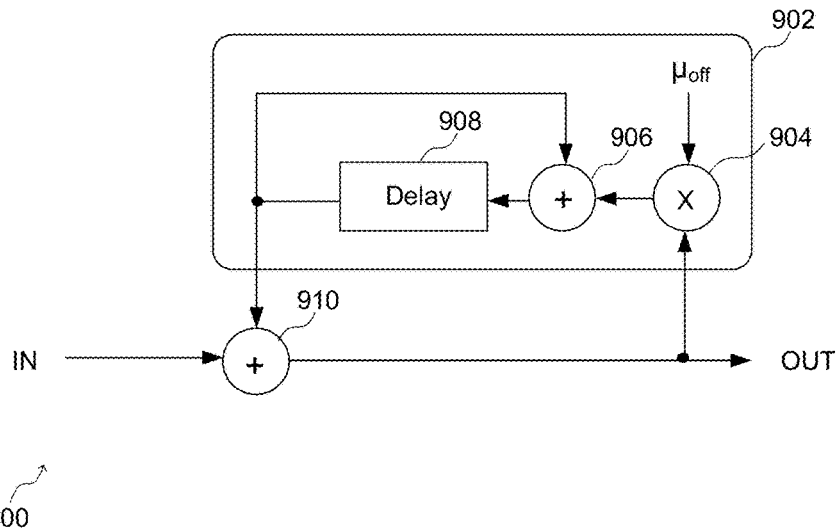
FIG. 9 is a block diagram of an offset calibration circuit that may be implemented in the time-interleaved calibration 800 of FIG. 8.

Turning now to FIG. 9, a block diagram of an offset calibration circuit 900 that may be implemented in the time-interleaved calibration circuit 800 of FIG. 8 is shown, where the offset calibration circuit (such as the offset calibration circuit 820 and 824 of FIG. 8) provide offset calibration for an output of the ADC. More particularly, an offset calibration block 902 comprises a multiplier 904 adapted to receive the output (OUT) of the offset calibration circuit and an offset coefficient $\mu_{off}$. An output of the multiplier is coupled to an adder 906 having an output coupled to a delay circuit 908 and an input receiving an output of the delay circuit. The output of the delay circuit is coupled to an input of an adder 910 that also receive the input signal (IN). The integration coefficient $\mu_{off}$ is used to adjust how fast the integration converges, where the faster the integration, the higher the amount of noise in the output as will be described in more detail below.

Figure 10:
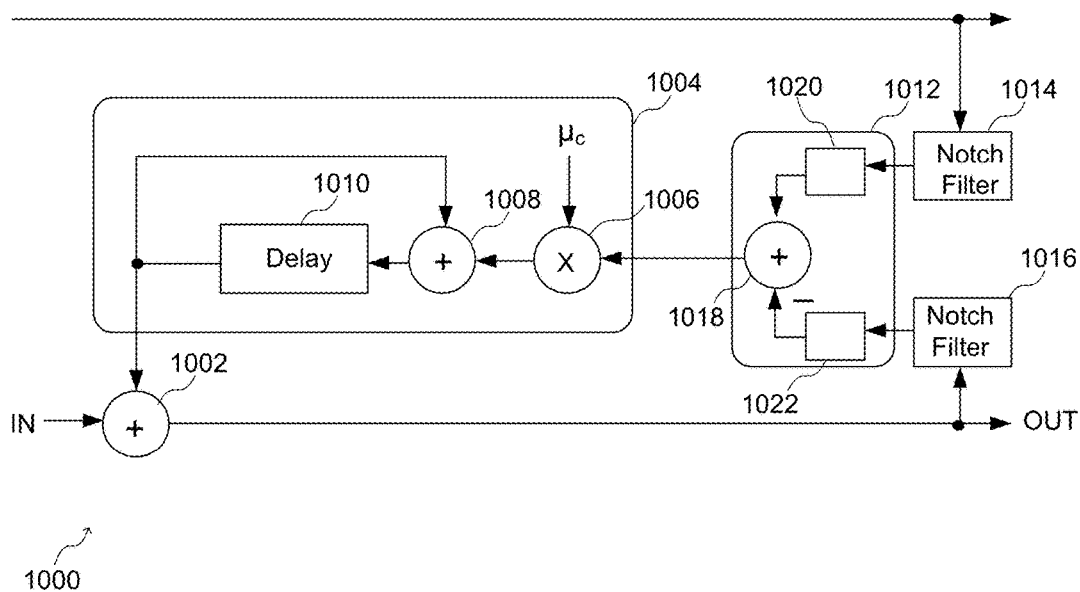
FIG. 10 is a block diagram of a gain calibration circuit that may be implemented in the time-interleaved calibration of FIG. 8.

Turning now to FIG. 10, a block diagram of a gain calibration circuit 1000 that may be implemented in the time-interleaved calibration circuit 800 of FIG. 8 is shown. The gain calibration circuit 1000 comprises an adder 1002 having an input coupled to a first calibration portion 1004 having a multiplier 1006 adapted to receive the output of a signals power difference detector (comprising 1014, 1016 and 1012) and the gain integration coefficient $\mu_c$. The gain integration coefficient $\mu_c$ represents the attenuation that is applied to the signals power difference. An output of the multiplier is coupled to an adder 1008 having an output coupled to a delay circuit 1010 and an input receiving an output of the delay circuit 1010. The output of the delay circuit is coupled to an input of an subtractor circuit 1012 that also receive the input signal (IN). The multiplier 1006 of the first calibration portion 1004 is coupled to receive an output of an subtractor circuit 1012 receiving a filtered signal of another stage by way of a first filter 1014, which may be a notch filter for example, and a filtered signal of a current stage by way of a second filter 1016. The subtractor circuit 1012 comprises a multiplier circuit 1020, which could be used for squaring an output of the first filter 1014, and a multiplier circuit 1022, which also could be used for squaring an output of the filter 1016, where outputs of the multiplier circuit 1020 and the multiplier circuit 1022 are coupled to an subtractor 1018.

Figure 11:
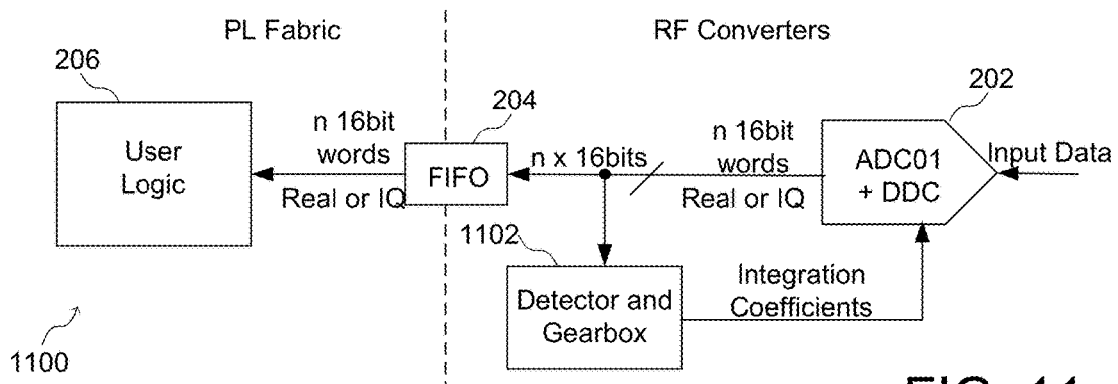
FIG. 11 is a block diagram showing a hardened circuit solution for implementing calibration settings.

Turning now to FIG. 11 is a block diagram showing a circuit 1100 having a hardened solution for implementing calibration settings. The circuit of FIG. 11 comprises a detector and gearbox circuit 1102 as a part of the hardened circuits and operating as a monitor for generating integrated coefficients that are coupled to the ADC 202. The Gearbox circuit is intended to sweep the integration coefficients which in turn varies the speed of the calibration itself. The input to the block is then used to detect disruptive events.

Figure 12:
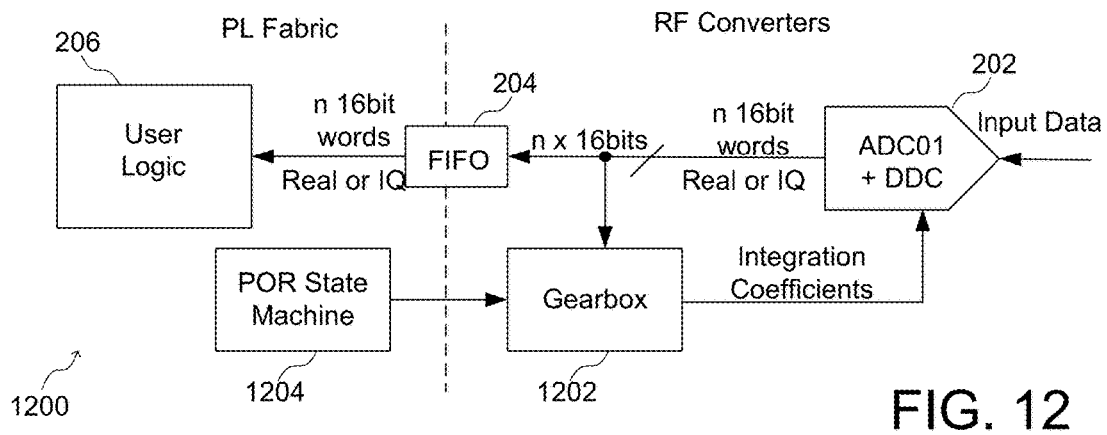
FIG. 12 is a block diagram showing a hardened circuit solution for implementing calibration settings having a power-on-reset state machine.

According to one implementation, the integration coefficients can be cycled-through at start-up to speed-up the power-up time of RF circuits. According to one implementation, integration may be started with low accuracy and fast convergence, and new integration coefficients may be provided that increase accuracy to meet a required performance. Embedding the coefficient gearbox as part of the FPGA fabric power-on state-machine. By enabling access to the gearbox from customer fabric IP, complex signal profilers can be used to optimize the performance of the calibration on-the-fly with minimum latency. Because optimizing the calibration can be very difficult to implement in discrete ADC solutions, the circuit arrangement of FIG. 12 provides an additional edge to FGPA enabled ADC designs over the competition. Further, the circuits and methods can take advantage of the FPGA programmable fabric to allow higher levels of intelligence and flexibility to more demanding applications without sacrificing on power and complexity on the hardened ADC circuitry. The following FIGS. 12 and 13 shows various embodiments of the invention where the detection and gearbox are both enabled in the fabric and hardened in the ADC.

Referring specifically to FIG. 12, a block diagram shows a circuit 1200 having a hardened solution for implementing calibration settings having a power-on-reset (POR) state machine that generates POR signals. In addition to a gearbox circuit 1202 that comprises a hardened circuit, a power-on-reset (POR) state machine 1204 is implemented in the PL fabric. According to the implementation of FIG. 12, a user can deploy specific hardware in the fabric to differentiate from the competition. That is, the FPGA fabric is used to control the gearbox. By managing the offset calibration blocks at start-up, it is possible to reduce the power-up time considerably.

Figure 13:
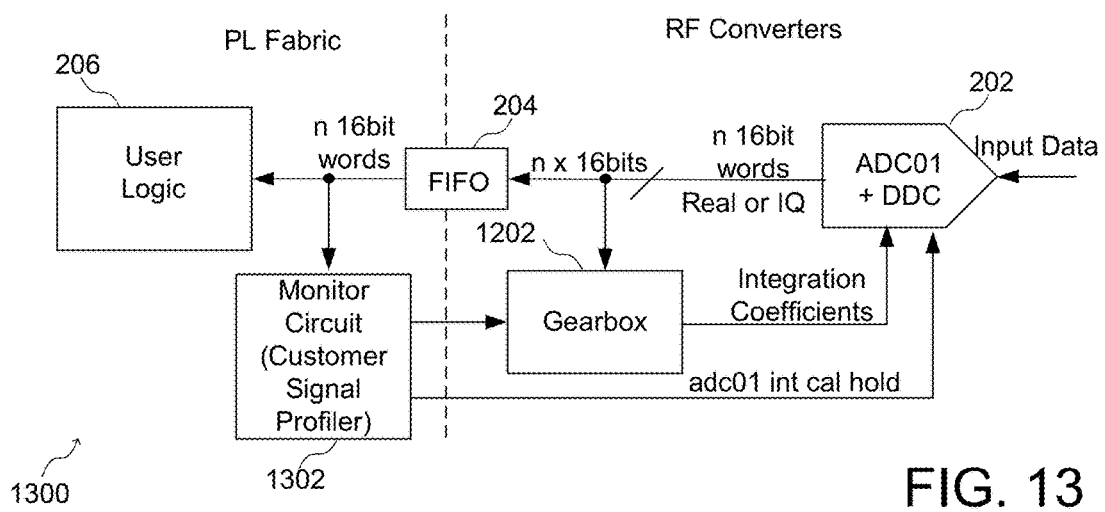
FIG. 13 is a block diagram showing a hardened circuit solution for implementing calibration settings having a customer signal profiler.

Turning now to FIG. 13, a block diagram shows a circuit 1300 having a hardened solution for implementing calibration settings and having a signal profiler. According to the implementation of FIG. 13, a customer signal profiler 1302 is implemented in the PL fabric. By implementing a customer signal profiler 1302, a user of the device having the circuit 1300 can provide specific control of the gearbox 1202 and the ADC 202. As also shown in FIG. 13, a hold signal generated by the monitor circuit 1302 could be provided to the ADC 202 as described above in reference to FIG. 2. That is, it should be noted that the various implementation of FIGS. 2-7 that relate to generating a hold signal could also be implemented in the implementations of FIGS. 8-18 that relate to generating integration coefficients.

Figure 14:
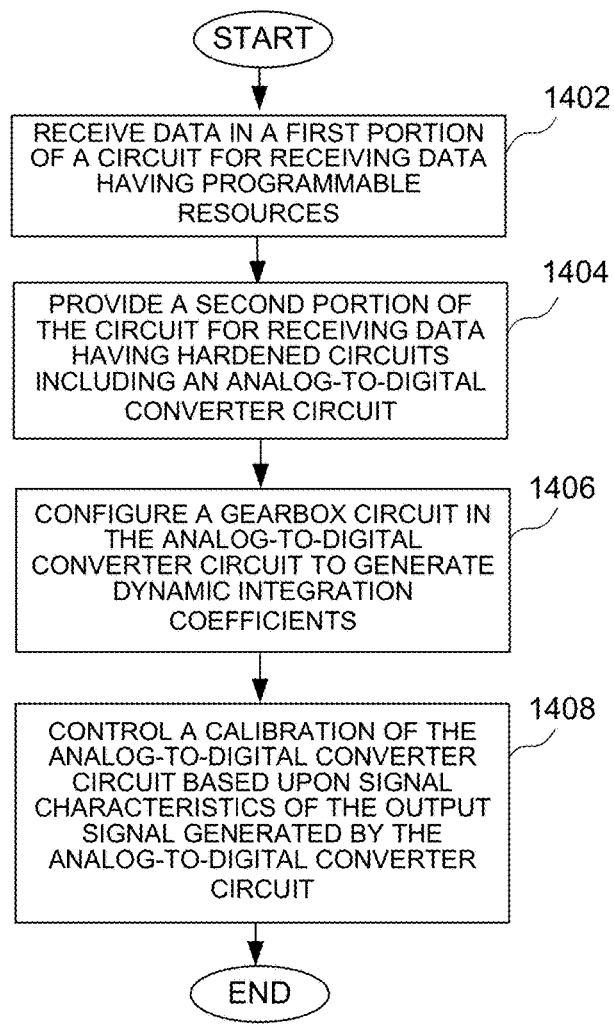
FIG. 14 is a flow chart showing a method controlling an analog-to-digital converter using dynamic integration coefficients.

Turning now to FIG. 14, a flow chart shows a method controlling an analog-to-digital converter using dynamic integration coefficients. More particularly, data is received in a first portion of a circuit for receiving data having programmable resources, such as the PL fabric, at a block 1402. A second portion of the circuit for receiving data is provided having hardened circuits including an analog-to-digital converter circuit, such as the RF converters, at a block 1404. A gearbox circuit is configured in the analog-to-digital converter circuit to generate dynamic integration coefficients at a block 1406. A calibration of the analog-to-digital converter circuit is controlled based upon signal characteristics of the output signal generated by the analog-to-digital converter circuit at a block 1408. In addition to generating integration coefficients, it should be understood that a hold signal for holding or freezing the calibration of an ADC circuit as described in reference to FIGS. 2-7 for example.

Figure 15:
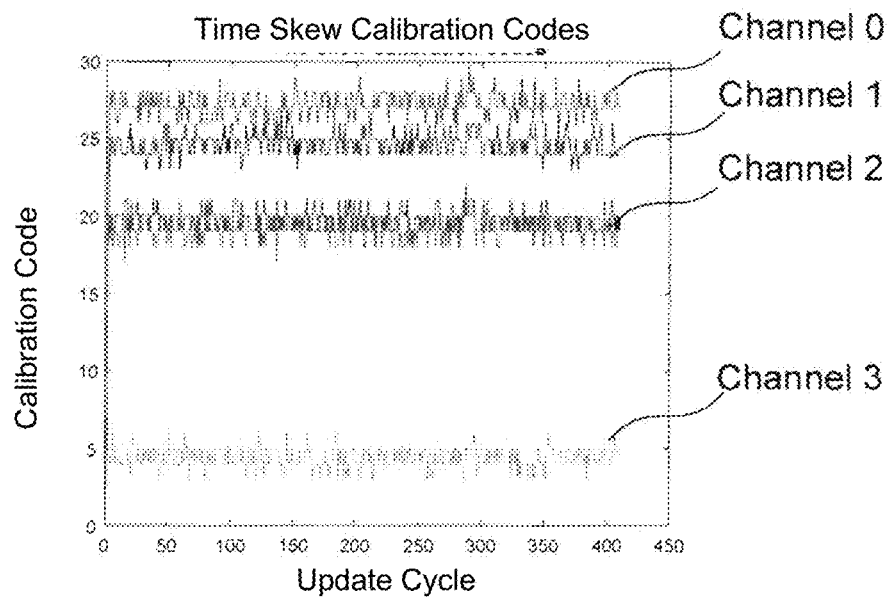
FIG. 15 is a timing diagram showing update cycles associated with first integration coefficients to coverage to a calibration code.
Figure 16:
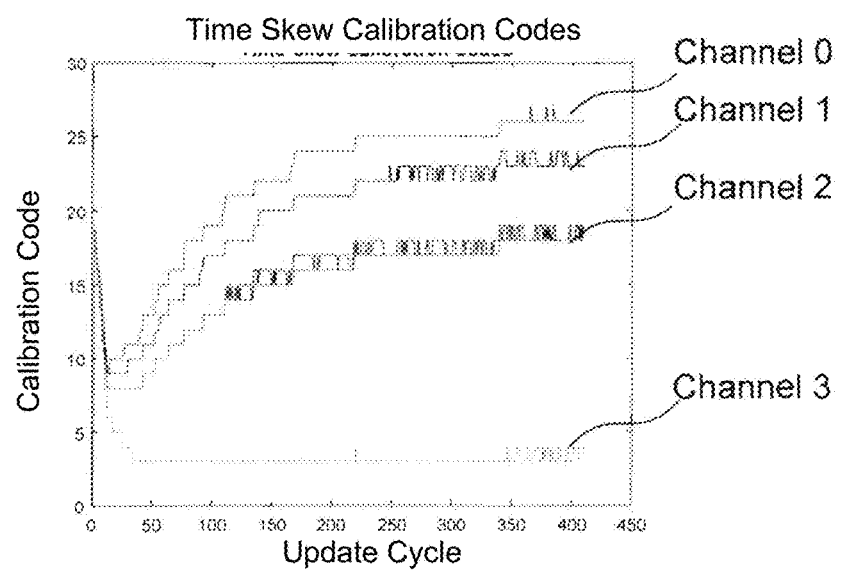
FIG. 16 is another timing diagram showing update cycles associated with second integration coefficients to converge to a calibration code.

Turning now to FIGS. 15 and 16, timing diagrams show update cycles associated with first and second integration coefficients to converge to a calibration code for time skew calibration, such as for TSCB 832, and more particularly the accuracy/speed trade-off when selecting the integration coefficients of the calibrations. Channels 0-3 are shown by way of example, where the calibration codes are used for independent parallel ADC channels. Because time skew for RF ADCs is important, the time steps used for correction must be very small (<30 fs) and the range must cover the full variability of the clock routing, which may be as large as 5 μs. In FIG. 15, a value of $2^{-15}$ is used as the coefficient to get very fast convergence (i.e. within less than 10 update cycles). However, as can be seen, a considerable amount of noise remains which translate to residual spurs in the spectrum from time to time. In FIG. 16, a value of $2^{-21}$ is used to get a less noisy spectrum, but with a slower convergence (i.e. convergence starting at approximately 150 update cycles). The amplitude of the signal also affects the convergence time. For low amplitude signals, it takes longer to converge for both the TSCB calibration and gain calibration blocks, which suffer from this effect as well from the frequency of the signal, where a lower signal frequency leads to a slower convergence.

A number of disruptive events have been identified that might require the interleaving calibrations to re-converge to a different state. For example, at device start-up, all calibrations (e.g. offset calibration, gain calibration, time skew calibration) are generally run. In the event of a long overvoltage event, the temperature of the device might change and the interleaving calibrations might take some time to converge. During long periods without input signal, which might happen in specific radar applications, recalibration may be necessary. As with a long overvoltage event, since the calibration blocks will be frozen for considerable time, the temperature might change significantly and the calibrations will take some time to converge. Further, when there are abrupt amplitude and frequency changes, a substantial increase of amplitude and/or frequency may require significant adjustment time to the interleaving calibrations. Accurate/slow integration coefficients may be set by default in the gain and time-interleaved calibration blocks. Any of these events will require a few hundreds of milliseconds or even seconds to get to a fully settled state again. According to some implementations, the default integration coefficients can be changed on the fly so that the users can select from a range of inaccurate/fast to accurate/slow integration coefficients.

Figure 17:
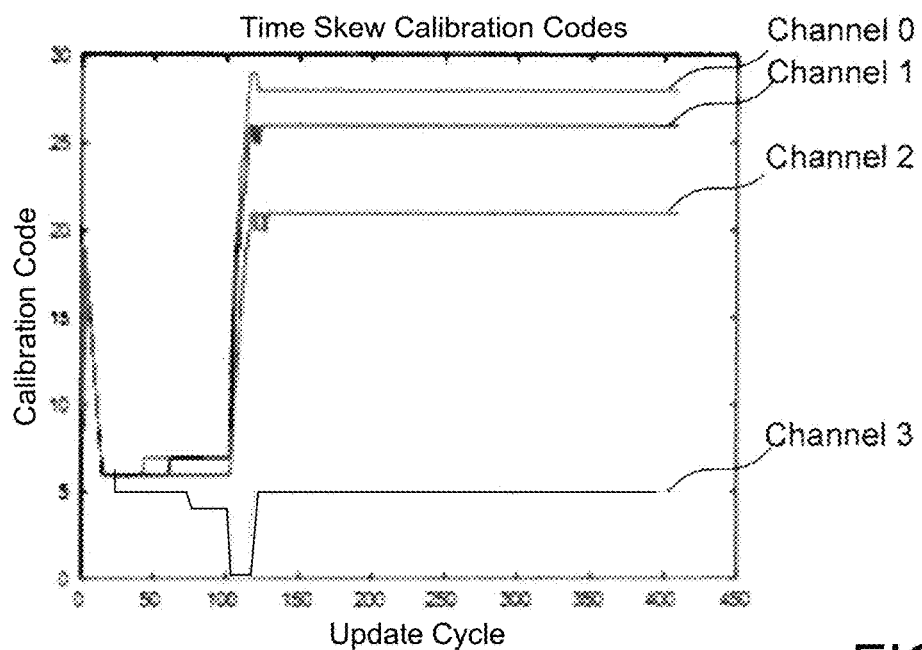
FIG. 17 is a timing diagram showing the settling of calibration when variable integration coefficients are used.

Turning now to FIG. 17, a timing diagram shows time skew calibration codes. According to one aspect of the invention, calibration codes are cycled through a few integration coefficients at start-up or when a disruptive event is identified to speed up the convergence time and keep the long-term accuracy. As shown in FIG. 17, the integration coefficient is set to $2^{-24}$ for the first 100 update cycles for which the calibration codes moved slowly. From update cycle 100 to 190, the integration coefficient cycles through starting at $2^{-15}$ and returning to the initial value. It can be seen that, by performing these calibration steps, the calibration codes in FIG. 17 converge very fast and then settle down without much noise. This calibration procedure having a first stage (e.g. such as a first 100 cycles) and a second stage (e.g. such as cycles after the first 100 cycles) is very suitable to speed-up the convergence of OCB1 and OCB2 during foreground calibration. Accordingly, the gearbox circuit provides first integration coefficients during a first number of update cycles, wherein the first integration coefficients are selected for convergence speed, and provides second integration coefficients during a second number of update cycles, wherein the second integration coefficients are selected for convergence accuracy.

Figure 18:
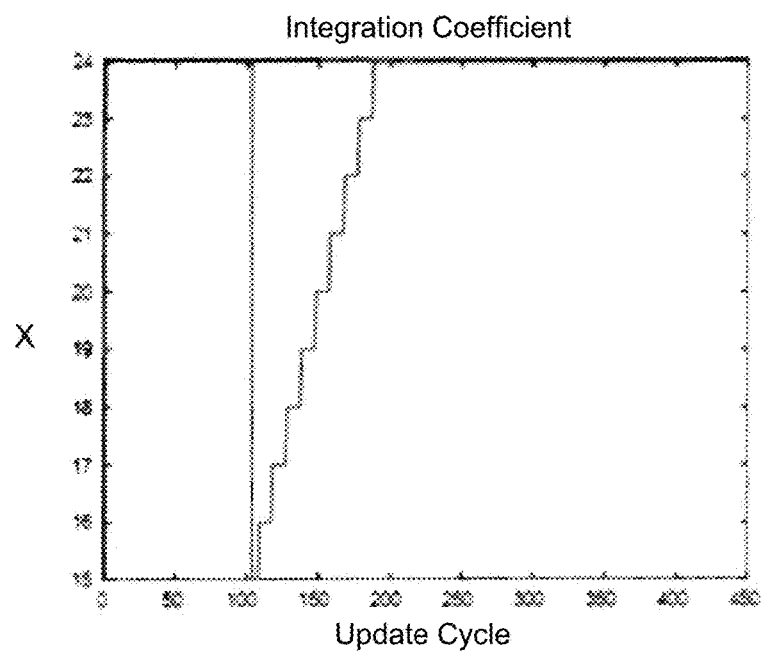
FIG. 18 is a timing diagram showing the variable integration coefficients used with the calibration of FIG. 17.

Turning now to FIG. 18, a timing diagram shows integration coefficients. The exponential representation of μoff or μc is represented as $\mu c = 2^{(-x)}$. In the plot of FIG. 18, the y-axis is the 'x' if $x=21 \Rightarrow \mu c = 2^{-21}$. FIG. 18 shows that x starts at 24 so $\mu c = 2^{-24}$ and remains at that level for 100 update cycles. During those 100 update cycles, the calibration codes of FIG. 17 vary very slowly, where it would take a long time to converge the calibration codes to the desired levels. After 100 update cycles, the system updates x to 15 and $\mu c = 2^{-15}$ and the calibration codes settle very fast. For example, x may be incremented every 10 update cycles until it reaches 24 again to reduce the integration noise level and increase the accuracy of the calibration.

Figure 19:
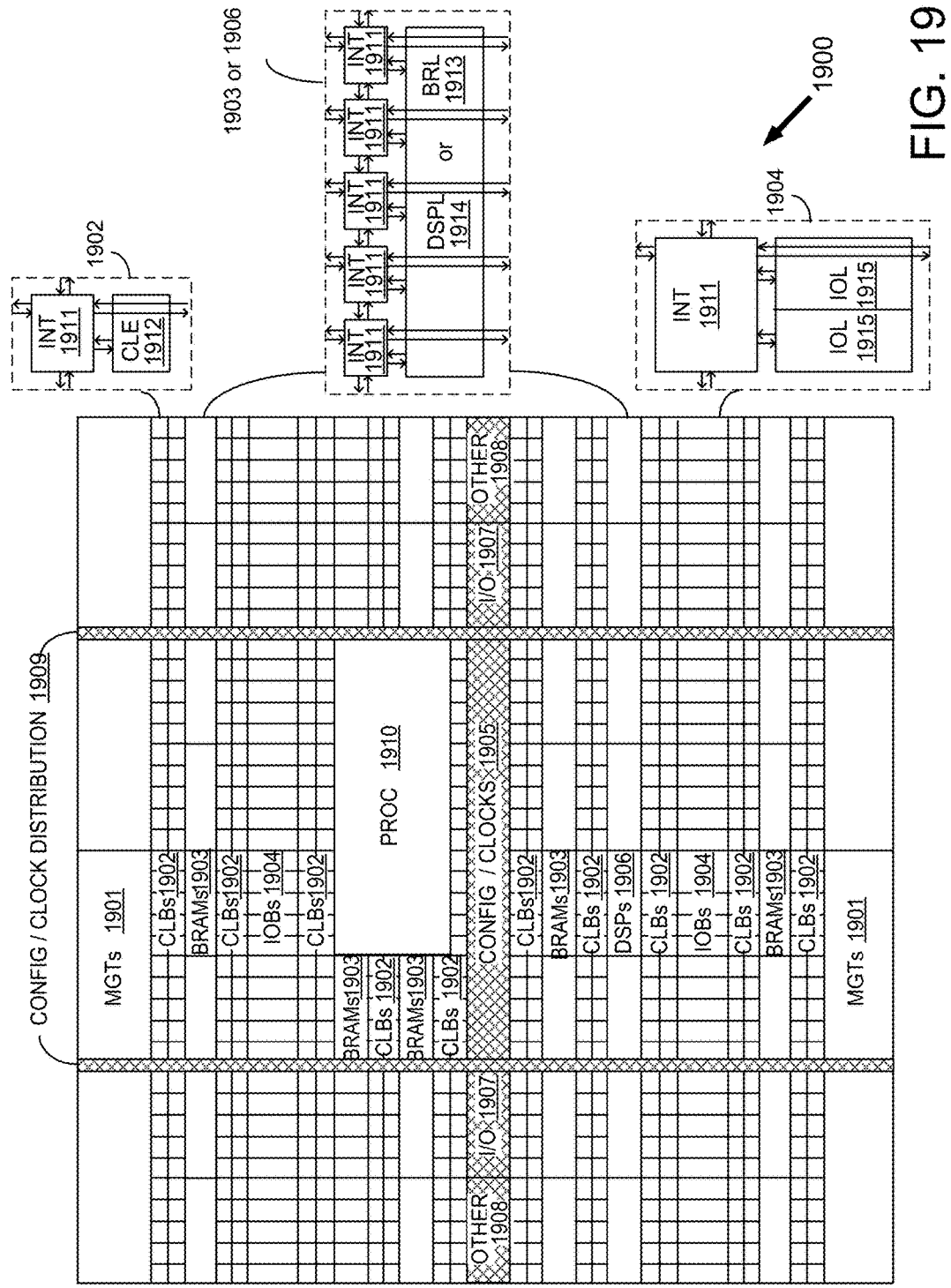
FIG. 19 is a block diagram of an integrated circuit having programmable resources.

Turning now to FIG. 19, a block diagram of an integrated circuit having programmable resources is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 19 comprises an FPGA architecture 1900 having a large number of different programmable tiles including multi-gigabit transceivers (MGTs) 1901, CLBs 1902, random access memory blocks (BRAMs) 1903, input/output blocks (IOBs) 1904, configuration and clocking logic (CONFIG/CLOCKS) 1705, digital signal processing blocks (DSPs) 1906, specialized input/output blocks (I/O) 1907 (e.g., configuration ports and clock ports), and other programmable logic 1908 such as digital clock managers, analog-to-digital converters, system monitoring logic, and so forth. Some FPGAs also include dedicated processor blocks (PROC) 1710, which may be used to implement a software application, for example.

In some FPGAs, each programmable tile includes a programmable interconnect element (INT) 1911 having standardized connections to and from a corresponding interconnect element in each adjacent tile. Therefore, the programmable interconnect elements taken together implement the programmable interconnect structure for the illustrated FPGA. The programmable interconnect element 1911 also includes the connections to and from the programmable logic element within the same tile, as shown by the examples included at the top of FIG. 19.

For example, a CLB 1902 may include a configurable logic element (CLE) 1912 that may be programmed to implement user logic plus a single programmable interconnect element 1911. A BRAM 1903 may include a BRAM logic element (BRL) 1913 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 1906 may include a DSP logic element (DSPL) 1914 in addition to an appropriate number of programmable interconnect elements. An 10B 1904 may include, for example, two instances of an input/output logic element (IOL) 1915 in addition to one instance of the programmable interconnect element 1911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 1909 extending from this column are used to distribute the clocks and configuration signals across the breadth of the FPGA. Some FPGAs utilizing the architecture illustrated in FIG. 19 include additional logic blocks that disrupt the regular columnar structure making up a large part of the FPGA. The additional logic blocks may be programmable blocks and/or dedicated logic. For example, the processor block PROC 1910 shown in FIG. 19 spans several columns of CLBs and BRAMs.

Note that FIG. 19 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 19 are purely exemplary. For example, in an actual FPGA more than one adjacent column of CLBs is typically included wherever the CLBs appear in order to facilitate the efficient implementation of user logic. While the implementation of FIG. 19 relates to an integrated circuit having programmable resources, it should be understood that the circuits and methods set forth above could be implemented in any type of device having a combination of programmable resources and hard blocks.

Figure 20:
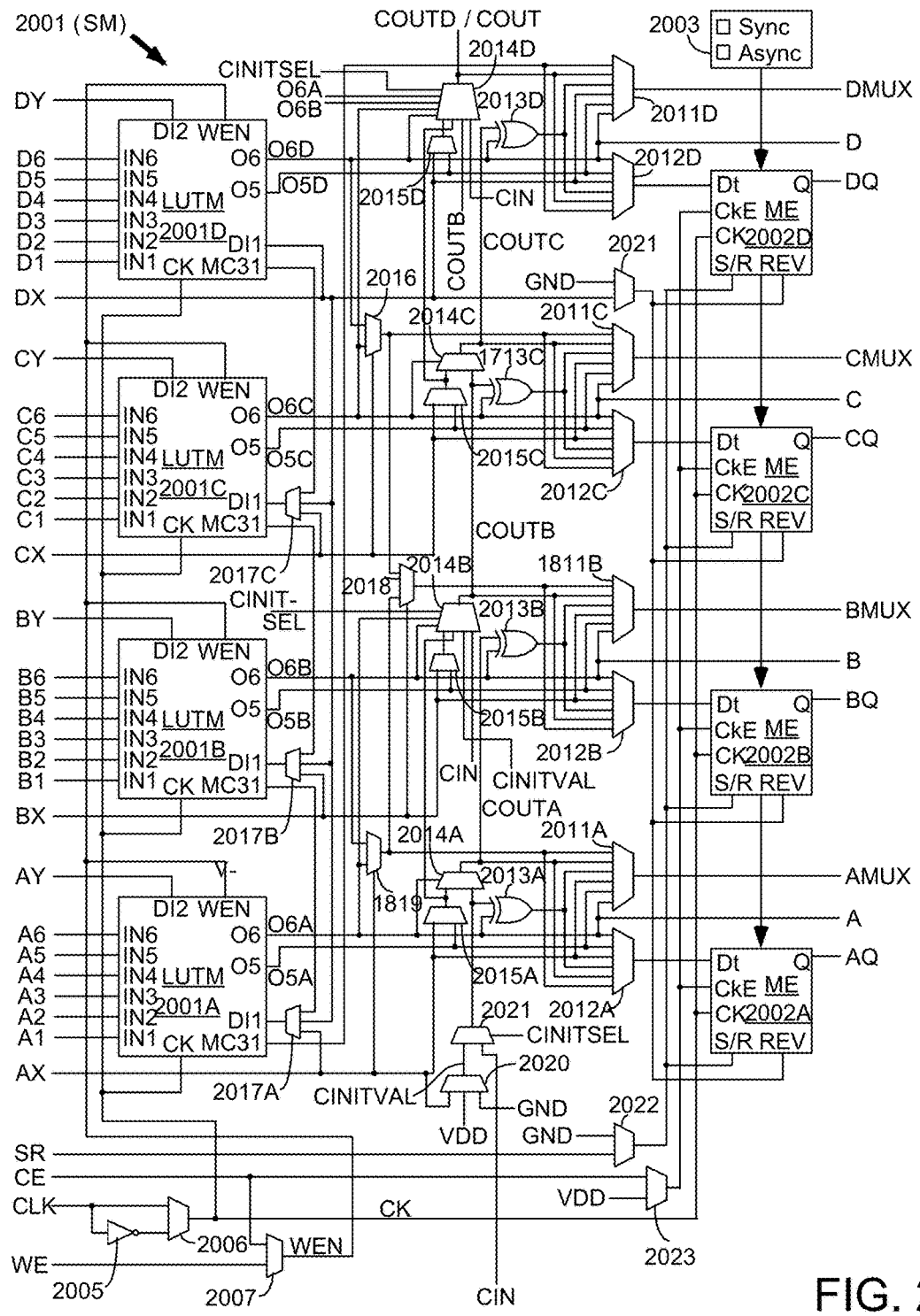
FIG. 20 is a block diagram of a configurable logic element that could be implemented in the integration circuit of FIG. 19.

Turning now to FIG. 20, block diagram of a configurable logic element of the device of FIG. 19 is shown. In particular, FIG. 20 illustrates in simplified form a configurable logic element, which is an example of Programmable Logic, of a configuration logic block 1902 of FIG. 19. In the implementation of FIG. 20, slice M 2001 includes four lookup tables (LUTMs) 2001A-2001D, each driven by six LUT data input terminals A1-A6, B1-B6, C1-C6, and D1-D6 and each providing two LUT output signals O5 and O6. The O6 output terminals from LUTs 2001A-2001D drive slice output terminals A-D, respectively. The LUT data input signals are supplied by the FPGA interconnect structure via input multiplexers, which may be implemented by programmable interconnect element 2011, and the LUT output signals are also supplied to the interconnect structure. Slice M also includes: output select multiplexers 2011A-2011D driving output terminals AMUX-DMUX; multiplexers 2012A-2012D driving the data input terminals of memory elements 2002A-2002D; combinational multiplexers 2016, 2018, and 2019; bounce multiplexer circuits 2022-2023; a circuit represented by inverter 2005 and multiplexer 2006 (which together provide an optional inversion on the input clock path); and carry logic having multiplexers 2014A-2014D, 2015A-2015D, 2020-2021 and exclusive OR gates 2013A-2013D. All of these elements are coupled together as shown in FIG. 20. Where select inputs are not shown for the multiplexers illustrated in FIG. 20, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 20 for clarity, as well as from other selected figures herein.

In the pictured implementation, each memory element 2002A-2002D may be programmed to function as a synchronous or asynchronous flip-flop or latch. The selection between synchronous and asynchronous functionality is made for all four memory elements in a slice by programming Sync/Asynch selection circuit 2003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 2002A-2002D are clocked by a clock signal CK, which may be provided by a global clock network or by the interconnect structure, for example. Such programmable memory elements are well known in the art of FPGA design. Each memory element 2002A-2002D provides a registered output signal AQ-DQ to the interconnect structure. Because each LUT 2001A-2001D provides two output signals, O5 and O6, the LUT may be configured to function as two 5-input LUTs with five shared input signals (IN1-IN5), or as one 6-input LUT having input signals IN1-IN6.

In the implementation of FIG. 20, each LUTM 2001A-2001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 2017A-2017C for LUTs 2001A-2001C), or to the two 32-bit RAMs via input terminals DI1 and DI2. RAM write operations in the LUT RAMs are controlled by clock signal CK from multiplexer 2006 and by write enable signal WEN from multiplexer 2007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 2001A may also be provided to the general interconnect structure for shift register chaining, via output select multiplexer 2011D and CLE output terminal DMUX. Accordingly, the circuits and methods set forth above may be implemented in a device such as the devices of FIGS. 19 and 20, or any other suitable device.

The method of FIGS. 4 and 14 may be implemented using the circuits as described as described above, or using some other suitable circuits. While specific elements of the method are described, it should be understood that additional elements of the method, or additional details related to the elements, could be implemented according to the disclosure of the figures.

It can therefore be appreciated that new circuits for and methods of receiving data in an integrated circuit have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. An integrated circuit comprising:
    a first portion having programmable resources;
    a second portion having hardened circuits including an analog-to-digital converter circuit configured to receive an input signal and generate an output signal; and
    a monitor circuit configured to receive the output signal generated by the analog-to-digital converter circuit;
    wherein the monitor circuit is configurable to hold a calibration of the analog-to-digital converter circuit based upon a threshold associated with at least one of a power or a frequency of the output signal generated by the analog-to-digital converter circuit; and
    wherein calibration is re-activated after the at least one of the power or the frequency of the output signal meets the threshold.

2. The integrated circuit of claim 1, wherein the monitor circuit comprises at least one of a level detection circuit, a power detection circuit, and an envelope detection circuit.

3. The integrated circuit of claim 1, wherein the monitor circuit is implemented in the programmable resources.

4. The integrated circuit of claim 1, wherein the monitor circuit monitors the output signal generated by the analog-to-digital converter circuit during background calibration of the analog-to-digital converter circuit.

5. The integrated circuit of claim 1, wherein the monitor circuit holds a calibration of the analog-to-digital converter circuit when a power of the output signal of the analog-to-digital converter circuit is lower than a power threshold or the frequency of the output signal of the analog-to-digital converter circuit is lower than a frequency threshold.

6. The integrated circuit of claim 1, wherein the analog-to-digital converter circuit comprises a gearbox circuit configured to generate dynamic integration coefficients.

7. The integrated circuit of claim 6, wherein the monitor circuit controls the gearbox circuit to vary at least one of a speed and an accuracy of the calibration of the analog-to-digital converter circuit.

8. The integrated circuit of claim 6, wherein the monitor circuit is implemented in the programmable resources of the first portion and provides power-on-reset signals to the gearbox circuit for receiving the input signals.

9. The integrated circuit of claim 6, wherein the gearbox circuit provides first integration coefficients during a first number of update cycles, wherein the first integration coefficients are selected for convergence speed, and provides second integration coefficients during a second number of update cycles, wherein the second integration coefficients are selected for convergence accuracy.

10. The integrated circuit of claim 6, wherein the monitor circuit is implemented in the programmable resources of the first portion and comprises a signal profiler for providing dynamic integration coefficients based upon user inputs.

11. A method of receiving input signals in an integrated circuit, the method comprising:
    providing a first portion of a circuit having programmable resources;
    providing a second portion of the circuit having hardened circuits including an analog-to-digital converter circuit;
    receiving an input signal at the analog-to-digital converter circuit;
    generating, by the analog-to-digital converter circuit, an output signal based upon the input signal;
    coupling a monitor circuit to receive the output signal generated by the analog-to-digital converter circuit; and
    configuring the monitor circuit to hold a calibration of the analog-to-digital converter circuit based upon a threshold associated with at least one of a power or a frequency of the output signal generated by the analog-to-digital converter circuit;
    wherein calibration is re-activated after the at least one of the power or the frequency of the output signal meets the threshold.

12. The method of claim 11, wherein configuring the monitor circuit to control a calibration of the analog-to-digital converter circuit comprises configuring at least one of a level detection circuit, a power detection circuit, and an envelope detection circuit to detect the output signal generated by the analog-to-digital converter circuit.

13. The method of claim 11, wherein configuring the monitor circuit to control a calibration of the analog-to-digital converter circuit comprises configuring the monitor circuit in the programmable resources.

14. The method of claim 11, further comprising monitoring the output signal generated by the analog-to-digital converter circuit during background calibration of the analog-to-digital converter circuit.

15. The method of claim 11, further comprising holding a calibration of the analog-to-digital converter circuit when a power of the output signal of the analog-to-digital converter circuit is lower than a power threshold or the frequency of the output signal of the analog-to-digital converter circuit is lower than a frequency threshold.

16. The method of claim 11, further comprising configuring a gearbox circuit to generate dynamic integration coefficients.

17. The method of claim 16, further comprising controlling the gearbox circuit to vary at least one of a speed and an accuracy of the calibration of the analog-to-digital converter circuit.

18. The method of claim 16, further comprising providing power-on-reset signals to the gearbox circuit for generating the integration coefficients to receive the input signals.

19. The method of claim 16, further comprising providing first integration coefficients during a first number of update cycles, wherein the first integration coefficients are selected for convergence speed, and providing second integration coefficients during a second number of update cycles, wherein the second integration coefficients are selected for convergence accuracy.

20. The method of claim 16, further comprising providing dynamic integration coefficients based upon user inputs.

* * * * *